United States Patent
Gudesen et al.

(10) Patent No.: US 6,683,803 B2
(45) Date of Patent: Jan. 27, 2004

(54) APPARATUS AND METHODS FOR DATA STORAGE AND RETRIEVAL

(75) Inventors: Hans Gude Gudesen, Brussels (BE); Per-Erik Nordal, Asker (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/318,137

(22) Filed: Dec. 13, 2002

(65) Prior Publication Data

US 2003/0151940 A1 Aug. 14, 2003

Related U.S. Application Data (60) Provisional application No. 60/339,431, filed on Dec. 14, 2001.

(30) Foreign Application Priority Data

Dec. 14, 2001 (NO) .......................................... 2001 6100

(51) Int. Cl.$^7$ ................................................ G11C 11/22
(52) U.S. Cl. ..................................... 365/145; 365/146
(58) Field of Search ................................. 365/145, 146, 365/51, 63; 257/752, 295

(56) References Cited

U.S. PATENT DOCUMENTS 5,060,191 A * 10/1991 Nagasaki et al. .......... 365/145
6,385,553 B1 * 5/2002 Naito et al. ................. 702/138

FOREIGN PATENT DOCUMENTS

EP  0 166 938 A2  1/1986

* cited by examiner

Primary Examiner—Vu A. Le
(74) Attorney, Agent, or Firm—Birch, Stewart, Kolasch & Birch, LLP (57) ABSTRACT

In a data storage apparatus comprising means for storing and retrieving data in respective write and read operations, and first and second set of addressing electrodes are provided, the latter set having electrodes that preferably are oriented orthogonally to the electrodes of the first set, and the electrodes (b, c) of the second set are provided as parallel twin electrodes located in parallel recesses or trenches (3) in the electrodes of the first set. The trenches compris a soft ferroelectric or electret memory material with piezoelectric properties such that memory cells (1) with two subcells ($\alpha_1$, $\alpha_2$) are formed in the trench (3) respectively between the electrodes (a) of the first set and the parallel twin electrodes (b, c) on either side of the latter. In a write operation data are encoded in the memory cells (1) by means of an applied voltage potential over the subcells ($\alpha_1$, $\alpha_2$). In a non-destructive readout operation of data encoded and stored in the memory cells (1) in this manner, the piezoelectric properties of the memory material (2) is employed for eliciting response signals from the subcells ($\alpha_1$, $\alpha_2$) of a memory cell (1) when the former are subjected to mechanical stresses in the lateral direction, such that the logical value stored in the memory cell (1) can be determined.

21 Claims, 12 Drawing Sheets

APPARATUS AND METHODS FOR DATA STORAGE AND RETRIEVAL

This application claims priority on provisional Application No. 60/339,431 filed on Dec. 14, 2001 and claims priority on foreign application No. 2001-6100 filed in NORWAY on Dec. 14, 2001, the entire contents of which are hereby incorporated by reference.

The present invention concerns a data storage apparatus with means for storing and retrieving data in respective write and read operations, wherein data are stored in a non-volatile manner as polarization states in ferroelectric or electret memory cells, wherein the memory cells are provided in a passive matrix-addressable array, wherein the memory cells can be individually addressed electrically for write and read operations, the addressing of the memory cell taking place via crossing electrodes of a respectively first and second electrode set, wherein each electrode set comprises parallel stripe-like electrodes such that the electrodes of the first set substantially are oriented orthogonally to the electrodes of the second set; a method for performing a non-destructive readout in the apparatus according to claim 1; and a method for poling pairs of piezoelectric storage cells for write operations in the apparatus according to claim 1.

Memory devices based on ferroelectric or electret polymer material have many advantages, like small cell footprint, stacking of memory layers, adaptability for reel-to-reel production/inkjet based production, low temperature processing, low cost, etc. Typically, data are read from the memory by so-called destructive readout, where reversal of polarization during the read operation makes it necessary to write back the information for further storage in the memory. A destructive read mode of this kind is undesirable for many applications; for instance, the number of fatigue cycles related to read is doubled. The latter may present a problem, since ferroelectric or electret based memories only can withstand a finite number of write cycles. Furthermore, having to switch the polymer film twice means that the power consumption is increased, as is the complexity of the required circuitry enabling such write back.

The destructive read itself is a rather slow process (typically hundreds of nanoseconds to several microseconds, subject to applied field). This implies that with destructive read the polymer memory is not suitable for a number of major applications, such as replacing fast cache SRAM memory. Finally, when cells are reduced in size, the reduced signal strength may make it difficult to implement polymer memory in state of the art designs, or use at all with ultra-dense lithography (<0.15 um).

It is well-known that many ferroelectric and electret materials, including both the well-known PVDF (polyvinylidene-difluoride) and the copolymer PVDF-TrFE (poly(vinylidene difluoride- trifluoroethylene)) have piezoelectric properties. In that connection there can be referred to Sessler and Gerhard-Multhaupt (editors) Electrets, Vol. 1 and Vol. 2, Chapt. 5, 8, 11 and 12 (3rd ed., Laplacian Press (1998)).

In European patent application EP-A2-0166 938 (Eiling & al.) which has a priority date of Jun. 1, 1984, there is disclosed a write and read method in combination with the data storage device based on a ferroelectric polymer memory layer, with the aim of increasing storage density and reducing access time. To this end data are stored in memory cells formed by a single domain in the polymer memory material. These domains are coded by being permanently polarized by an applied electric field and coded in accordance with the direction of the field, i.e. with a positive or negative polarization in the memory layer. For reading the data this application discloses the use of pyroelectric or piezoelectric activation of the polarized domains. This activation is envisaged to take place over the suitably arranged electrode means in a matrix-addressable memory cell array in a ferroelectric memory material, preferably e.g. poly (vinylidene difluoride-trifluoroethylene) (PVDF-TrFE), such that activation of a memory cell would take place either pyroelectrically or piezoelectrically, respectively by means of an applied heating current pulse or by applied pressure or tension.

Employing matrix-addressing, the proposed write and-read methods according to EP-A2-0168 938 moreover would allow a parallel write/read. An attainable storage density of $10^8$ bit/cm$^2$ is stated. It is indicated that the access time for a pyroelectric read would be of the order $10^{-9}$ s. No indication is given for attainable access times for readout based on piezoelectric effects. Furthermore there is no indication in this application of the attainable performance in the small-signal range, neither with regard to access speed, applicable voltage levels, frequencies, detection reliability and noise immunity. However, since it is envisaged that non-destructive readout methods for memories based on ferroelectric polymers may operate in the small-signal range, particularly attainable signal/noise ratios and detection levels will be of major concern.

Hence it is a major object of the present invention to provide a data-storage apparatus allowing non-destructive read operations based on piezoelectric effects that can be obtained in a ferroelectric or electret memory material.

It is also a major object of the present invention to provide a very fast non-destructive readout method based on piezoelectric effects and with much improved signal/noise ratio as compared with prior art.

The above objects as well as further features and advantages are achieved with a data storage apparatus according to the present invention which is characterized in that the first set of electrodes comprises a plurality of parallel trenches extending horizontally with an orthogonal orientation to the electrodes and vertically downwards from a top surface thereof for a distance less than the thickness of the electrodes and having a substantially rectangular profile, that at least a ferroelectric or electret memory material is provided in the trenches and covering the sidewalls thereof, that the second set of electrodes is provided as a dual set of electrodes, each comprising parallel twin electrodes provided in said trenches and parallel therewith and without mutual contact with the electrodes of said first set, that the ferroelectric material is provided in at least a portion of the volume of the trenches not occupied by the electrodes, said ferroelectric or electret material being a soft or elastic ferroelectric or electret material with piezoelectric properties and in addition providing electrical insulation between the electrodes of the second set and the electrodes of the first set, whereby the twin electrodes of the second set under a suitably applied force can be displaced laterally in the soft ferroelectric or electret material with piezoelectric properties such that a piezoelectric effect is generated therein, and that said soft ferroelectric or electret material with piezoelectric properties in the volumes between the twin electrodes of the second set and the electrodes of the first set forms subcells of the memory cells in said trenches, said subcells capable of being poled for a write operation by applying an electric field between respective twin electrodes and crossing electrodes of the first set, such that the memory cells are polarized to store at least one of two or more logical values in the form of a set of polarization states in said subcells and can be read non-destructively by applying voltage potential between the twin electrodes, and/or between at least one of the latter and at least one of proximal electrodes of the first electrode set, and over the ferroelectric or electret material of the subcells which are subjected to tensile and/or compressive stresses enabling the detection of parameters deriving from the polarization states thereof by means of piezoelectric effects in response to strains thus induced in said subcells, whereby the logic state of the subcells of a memory cell can be found and the logical value or values stored in a memory cell containing the subcells can be determined.

The above objects as well as further features and advantages are also achieved with a method which is characterized by the readout of data being performed by subjecting the subcells of the memory cells selected for read operations to tensile and/or compressive force and concurrent detection of phase and/or polarity and/or magnitude of piezoelectrically generated voltage or current from said subcells in response to strains resulting from the application of said tensile and/or compressive force.

Finally, the above objects as well as further features and advantages are achieved with a method for poling pairs of piezoelectric memory cells for a write/read operation in the apparatus according to the invention and with the poling method characterized by poling each cell of the pair in one of two poling directions oriented orthogonally relative to the twin electrodes opposing each cell of the pair, whereby all four possible permutations of the poling directions can be realized in the two cells of the pair.

Further features and advantages of the present invention shall be apparent from the appended dependent claims.

The invention shall now be discussed in more detail in terms of various preferred exemplary embodiments and with reference to the appended drawing figures, of which

The general background of the present invention shall now be briefly mentioned, with a more comprehensive discussion of the various preferred embodiments of the apparatus and methods according to the invention to follow further below.

Basically the present invention permits information content in ferroelectric or electret memory cells to be read out non-destructively, by employing the piezoelectric effect in ferroelectric or electret materials to generate a physical driving force on individual memory cells, and to detect the polarization (logic-state)-dependent piezoelectric voltage response from those cells. Generic architectures are described, whereby piezoelectric driver and memory cells can be laid out densely in a passive matrix addressable array. These architectures involve polarization of ferroelectric or electret material in a lateral direction, i.e. parallel to the supporting substrate and combine micromechanical structures, resonant or non-resonant, that are compatible with layered stacking of multiple memory structures, to provide high volumetric data storage densities.

Various preferred embodiments shall now be discussed. It is to be understood that drawing figures aim at illustrating the essential and basic layout of the structural parts of the inventive apparatus, and the general principles behind the inventive method for reading data therefrom. Moreover, for simplicity's sake the memory material shall in the following be termed ferroelectric, although it could also be an electret material.—Actually ferroelectric materials can properly be regarded as a subclass of electret materials.

Figure 1A:
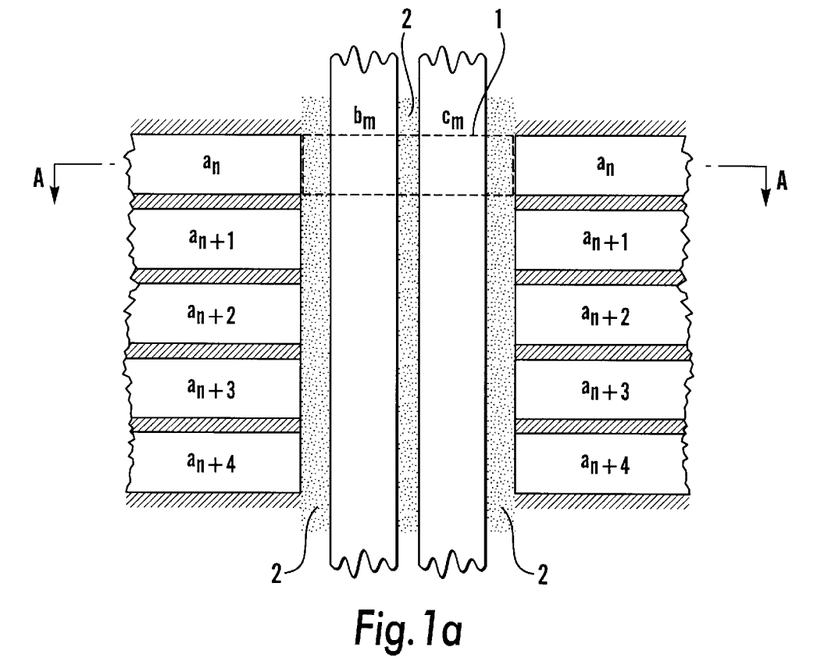
FIGS. 1a and 1b show respectively a plan view and cross section thereof taken along line the A—A in FIG. 1a of a portion of a memory cell array in a first preferred embodiment of the apparatus according to the present invention, FIGS. 2a and 2b correspondingly a schematic variant of the embodiment in FIGS. 1a and 1b, FIG. 3 schematically shows a plan view of a passive matrix arrangement according to the preferred embodiment in FIG. 1, FIGS. 4a–d show the steps of a poling sequence in a write operation on a portion of the memory array in the apparatus according to the present invention, FIGS. 5a,c and 5b,d respectively plan views and cross sections taken along the lines A—A in FIGS. 5a and 5b, and schematically illustrating the principle for performing a readout in the apparatus according to the present invention and in accordance with an embodiment of a method according to the present invention, FIGS. 6a and 6b respectively a plan view and a cross section thereof, taken along the line A—A of the former, of a portion of a second preferred embodiment of the apparatus according to the present invention, FIGS. 7a–d the poling of memory cells for a write operation in the embodiment of the apparatus as rendered in FIGS. 6a and 6b, FIGS. 7a and 7c being a plan view and FIGS. 7c and 7d respective corresponding matrix arrangements thereof, and FIGS. 8a,c and 8b,d respectively plan views and cross sections thereof taken along the lines A—A of FIG. 8a and 8c, illustrating a method for data readout in the embodiment in FIGS. 6a and 6b according to the present invention, and based on a poling sequence as shown in FIGS. 7a–d.
Figure 1B:
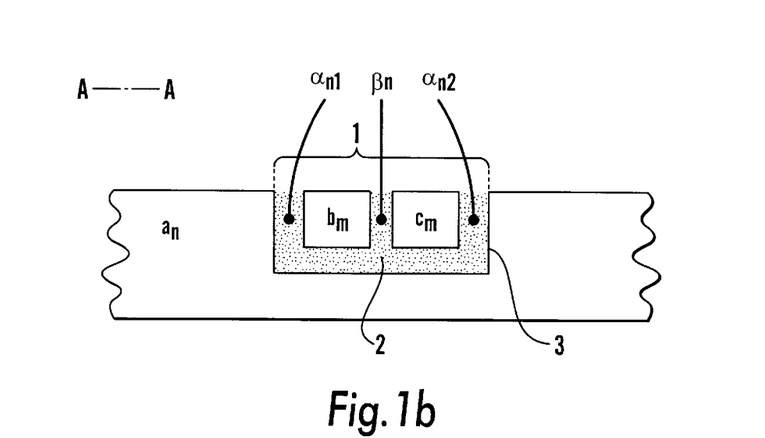

FIG. 1a shows a plan view of portion of an array of memory cells according to one preferred embodiment of the present invention, while FIG. 1b shows a cross section thereof taken along the line A—A. The location of a single memory cell 1 is roughly indicated by a stitched outline. The array of electrodes $a_n$, $a_{n+1}$, $a_{n+2}$, . . . , crosses a dual set of electrodes $b_m$ and $c_m$ which are embedded in an insulating, mechanically soft and elastic material 2 filling a trench 3 formed in the electrodes $a_n$, as best can be seen in FIG. 1b. The material 2 in the trench 3 is preferably a ferroelectric polymer, which can be poled in an electric field of strength exceeding its coercive field. Once poled, the ferroelectric polymer retains its polarization, the direction and strength of which represents a logical value in a non-volatile memory cell arrangement formed by the matrix of intersecting, embedded electrodes as shown partly in FIG. 1a. At each crossing between an electrode $a_n$ and a twin electrode set $b_m$ and $c_m$, three piezoelectrically active subcells of a memory cell 1 can be defined, indicated by $\alpha_{n1}$, $\alpha_{n2}$ and $\beta_n$ in FIG. 1b. Subcells $\alpha_{n1}$ and $\alpha_{n2}$ correspond to the volume of ferroelectric polymer subjected to strong electric fields when a voltage is applied between the common electrode $a_n$ and electrodes $b_m$ and $c_m$, respectively. While these subcells are small, the cell $\beta_n$ corresponds to the elongated volume of ferroelectric polymer between electrodes $b_m$ and $c_m$ that is subjected to a strong electric field when a voltage is applied between the latter two. Poling endows the ferroelectric polymer with a piezoelectric response, which in the configuration shown in FIGS. 1a, 1b causes the twin electrodes $b_m$, $c_m$, to move laterally in the trench 3 (i.e. in the direction of the electrode $a_n$), the exact direction and magnitude of the motion being dependent on the poling direction in the ferroelectric material 2 and the direction and strength of the electric field in the subcells $\alpha_{n1}$, $\alpha_{n2}$ and $\beta_n$.

Figure 2A:
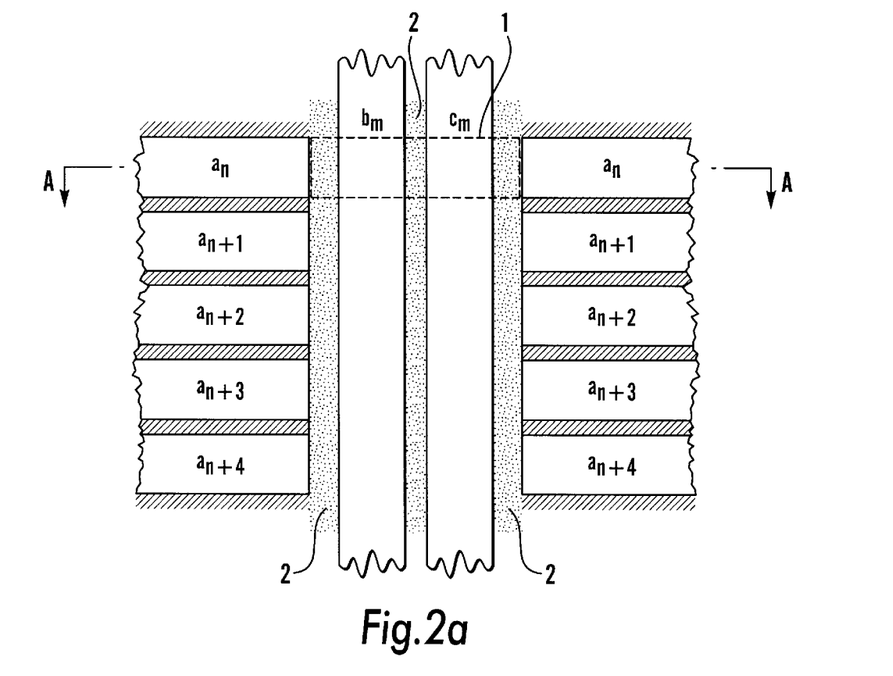

FIG. 2a shows a plan view of a variant of the basic design in FIGS. 1a and 1b, where the bottom of the trench 3 is filled with a support material 4 different from the ferroelectric material 2 inside the subcells $\alpha_{n1}$, $\alpha n_2$ and $\beta_n$. This is seen to advantage in FIG. 2b, which shows a cross section taken along the line A—A in FIG. 2a. The memory cell 1 is as before indicated by the stitched outline. By appropriate selection of the support material 4 in the bottom of the trench 3, the mechanical response of the electrodes $b_m$ and $c_m$ can be optimized for given applications. The support material 4 does not need to be ferroelectric or piezoelectric and can be chosen from a wide range of materials. Thus, it may be soft and elastic, providing small restraint on lateral motion of the electrodes $b_m$ and $c_m$. In certain cases, its mechanical dissipation properties may be selected so as to influence the mechanical motion characteristics of the electrodes $b_m$, $c_m$. An example of this is adjustment of energy dissipation for achieving a desired mechanical Q value during resonant excitation of subcells $\alpha_{n1}$, ($\alpha_{n2}$, $\beta_n$. To obtain specific mechanical characteristics, the bottom layer material 4 may or may not be bonded to the overlaying ferroelectric material 2 of the subcells $\alpha_{n1}$, $\alpha_{n2}$, $\beta_n$ and/or the electrodes $b_m$, $c_m$.

Figure 2B:
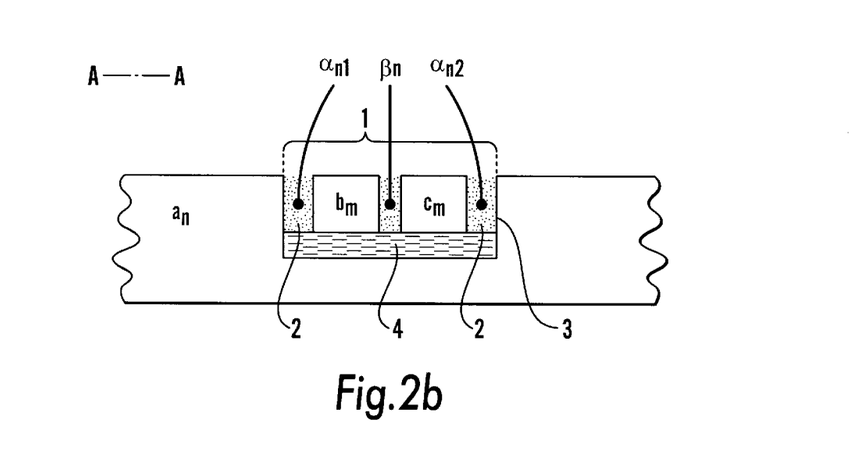
Figure 3:
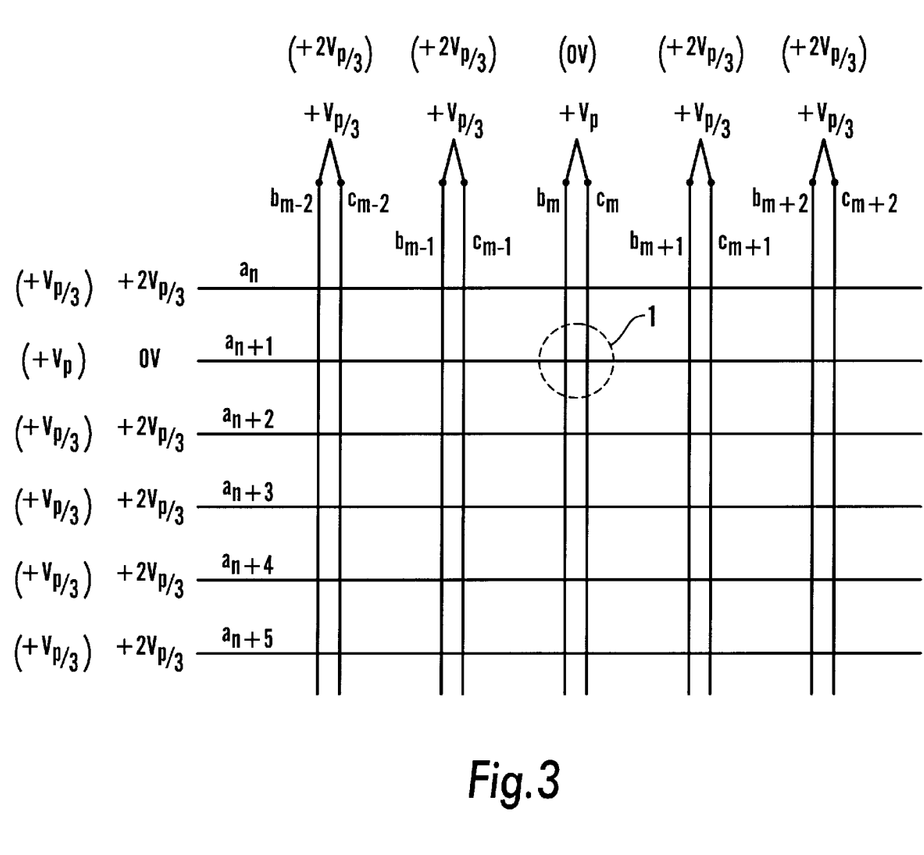

FIG. 3 shows schematically a cross-point passive matrix arrangement representing a preferred embodiment according to the present invention. Only the electrode layout is rendered. A memory cell 1 corresponding to the one shown in FIGS. 1b and 2b is shown within a stitched outline. This addressing arrangement differs from the traditional passive matrix addressing schemes of prior art in that the "vertical" electrodes now are the parallel twin electrodes $b_m$ and $c_m$ ($1 \leq m \leq M$), where M is the number of memory cells 1 along each horizontal electrode $a_n$ ($1 \leq n \leq N$), where N is the number of memory cells 1 along each vertical electrode set $b_m$, $c_m$. As is apparent, data can be stored at M×N crossing points in the matrix by appropriately poling the ferroelectric material 2 in the memory cells defined at each crossing point. According to the present invention, the data-carrying subcells of a memory cell 1 are of the type $\alpha_{n1}$ and $\alpha_{n2}$, while the macroscopic subcells $\beta_n$ are used for reading out the stored data (cf. below). As can be seen from FIGS. 1b and 2b, subcells $\alpha_{n1}$ and $\alpha_{n2}$ can each be poled such that the polarization points either from the sidewall of the trench 3 towards one of the twin electrodes $b_m$ or $c_m$, or in the opposite direction. This shall in principle provide four different combinations of poling arrangements and would allow a permutation of the polarization direction on the subcells $\alpha_{n1}$, $\alpha_{n2}$. However, when a passive matrix addressing arrangement is used to pole a ferroelectric material in the matrix crossing points, it is well known in prior art matrix addressing with single electrodes in both horizontal and vertical directions that the voltages that are applied to the crossing lines during poling (writing) of individual memory cells must be chosen with care, to avoid disturbing non-selected cells at other crossing points in the matrix. In this connection one may refer to, e.g. Norwegian Patent application No. 20003508 or the corresponding published International application WO02/05287, and references contained therein. A closer study shows that the disturbance of non-addressed cells can be minimized by coordinated application of voltages on all matrix electrodes. One solution is shown in FIG. 3, exposing non-selected cells to a maximum of ⅓ of the voltage $V_P$ employed to pole selected cells during the writing cycle.

Figure 4A:
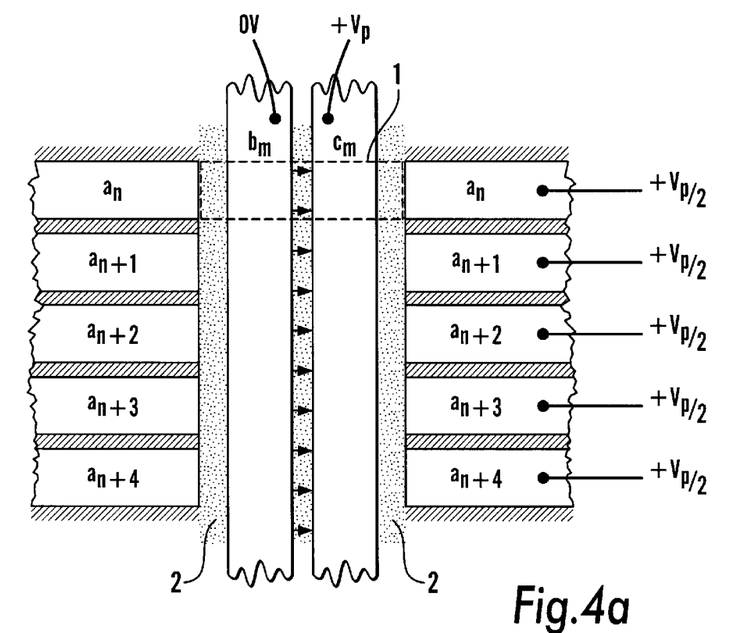
Figure 4B:
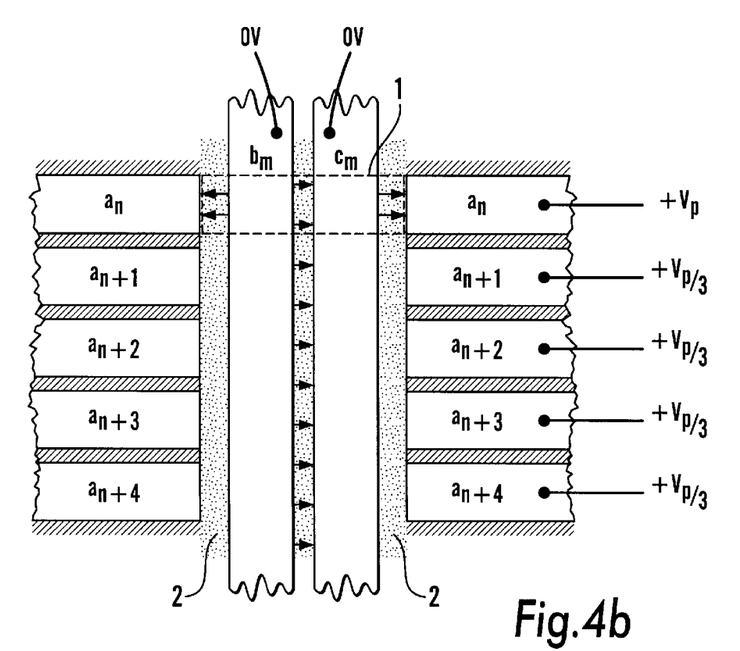
Figure 4C:
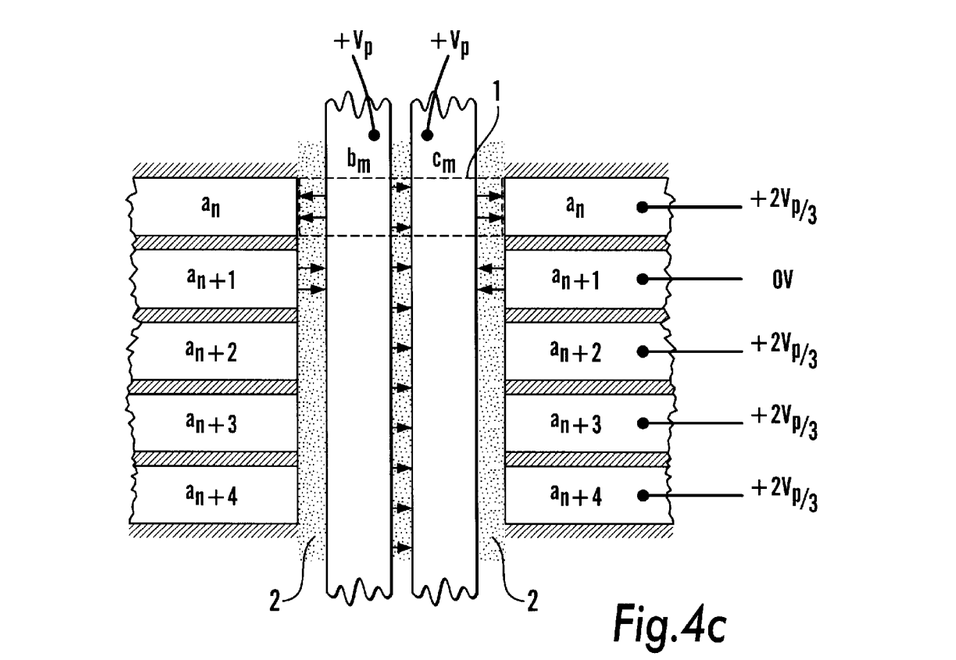
Figure 4D:
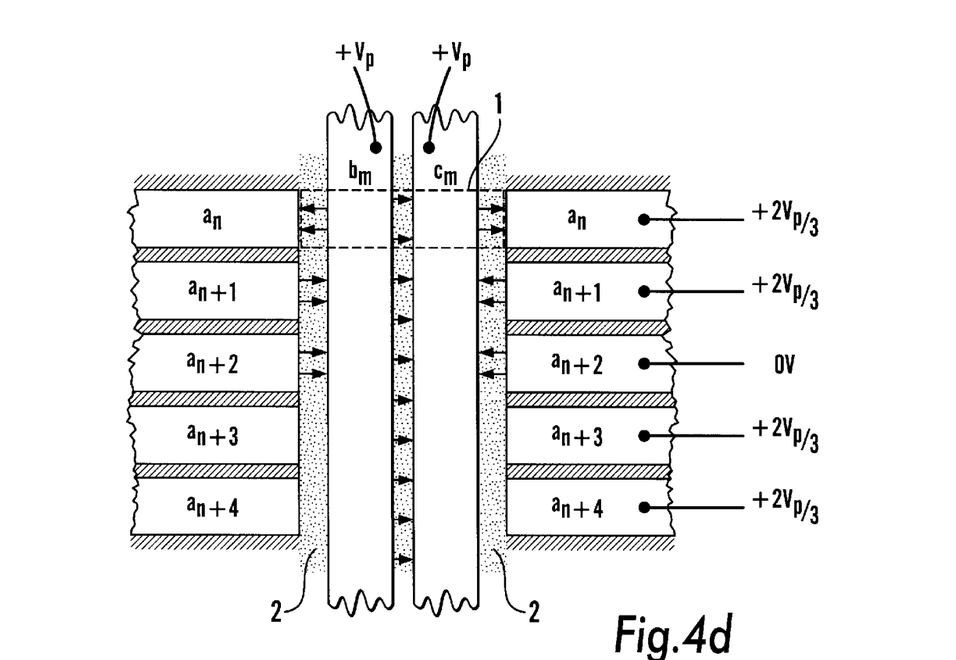

FIGS. 4a–4d show the first steps in a poling sequence amounting to activation and write operations for a portion of the memory matrix comprising five memory cells 1, each of these occupying a corresponding location to the one indicated in either FIG. 1a or FIG. 2a, but not specifically shown here. First, the subcell $\beta_n$ is poled to prepare it to function as a driver cell during subsequent readout of data (cf. below). This is achieved as shown in FIG. 4a by applying a voltage $+V_P$ between electrodes $b_m$ and $c_m$. This voltage is chosen to create an electric field in the ferroelectric that exceeds the coercive field, causing the ferroelectric to polarize in the direction shown by arrows in the figure. All crossing electrodes $a_n$, . . . are shown to be maintained at $+V_p/2$, leading to little or no polarization response in all subcells $\alpha$ due to the strongly nonlinear hysteresis characteristics of the ferroelectric. This voltage may be chosen otherwise, or the electrodes $a_n$, . . . may be allowed to float, since the polarization states in the subcells $\alpha$ shall subsequently be set during the writing operation. FIG. 4b shows how subcells $\alpha_{n1}$ and $\alpha_{n2}$ on electrode $a_n$ are poled for a write operation to encode a polarization state which in this case is taken to represent one bit of information, e.g. a logic "1". As can be seen, the voltages that are applied cause the polarization to be directed symmetrically from the twin electrodes $b_m$, $c_m$ and outwards towards the sidewalls of the trench 3, while the voltages on all the other subcells $\alpha$ along the twin electrodes remains below $+V_p/3$, i.e. below the polarization switching threshold. FIG. 4c shows the encoding of a logic state "0" on electrode $a_{n+1}$. As can be seen, the polarization in cells $\alpha_{n1}$ and $\alpha_{n2}$ for electrode $a_{n+1}$ is reversed compared to the case for electrode $a_n$. The set of voltages applied to the electrodes in the matrix are in this case as shown locally in FIG. 4c, and for the complete matrix as shown in FIG. 3. In FIG. 3 are also shown the set of voltages (in parentheses) that would be used to write a "1" bit into the memory cell 1 at $a_{n+1, (bm}$, $c_m)$, indicated by the stitched circle. Further writing to the matrix proceeds in analogous fashion, cf. FIG. 4d. It may be noted that the multibit coding apparently possible by permuting the polarization directions in cells $\alpha_{n1}$ and $\alpha_{n2}$ as mentioned above, has not been invoked here. Closer scrutiny shows that this shall entail voltages between $b_m$ and $c_m$ exceeding $+V_p/3$ during the writing cycle as shown. In this regard see, however, the discussion of another preferred embodiment of the present invention, below).

Figure 5A:
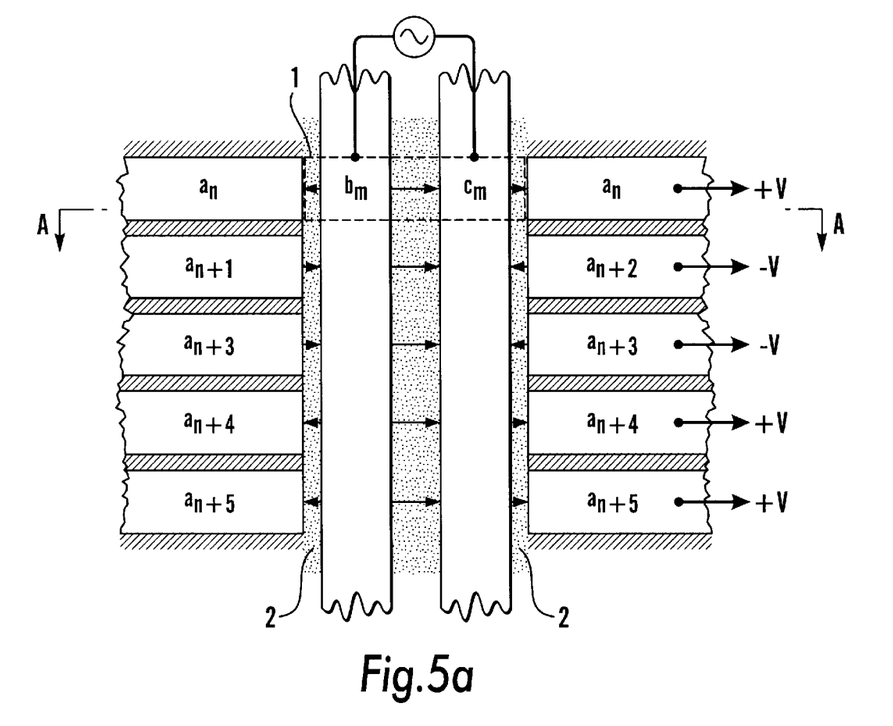
Figure 5B:
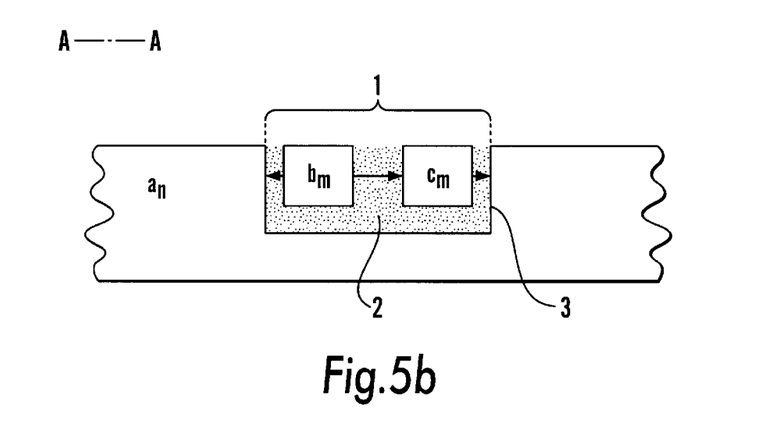
Figure 5C:
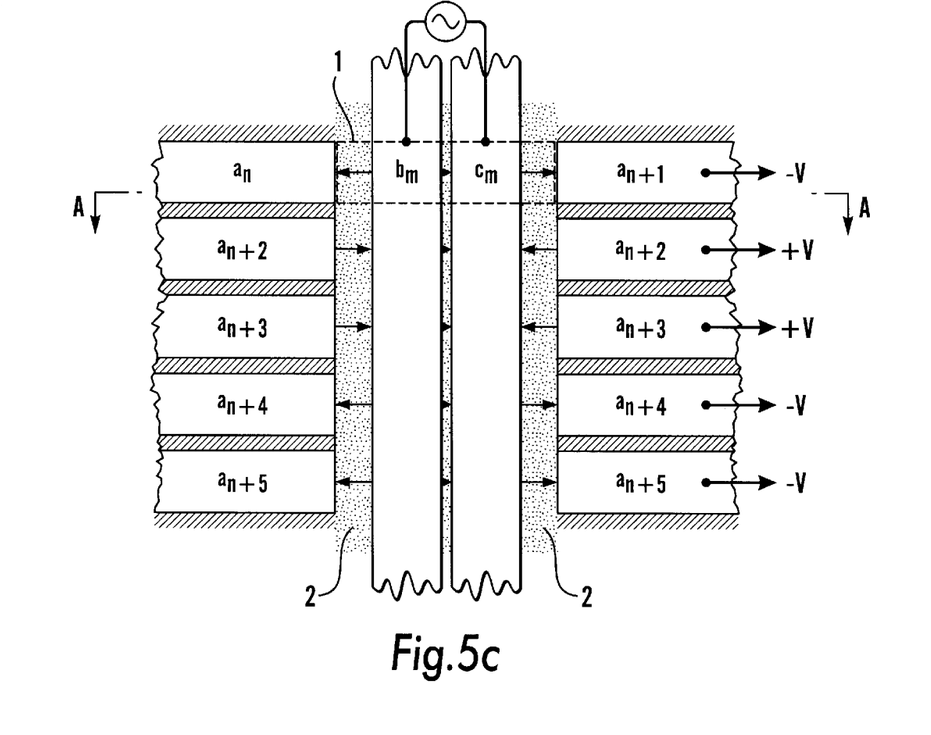
Figure 5D:
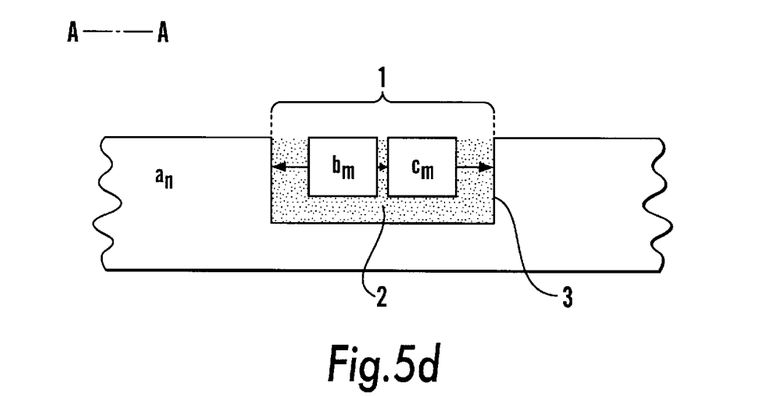

FIGS. 5a–5d show how data can be read out from the matrix. FIGS. 5a and 5c show a plan view of the memory matrix at two different time instants, FIGS. 5b and 5d the respective cross sections thereof taken along the lines A—A. The approximate location of a memory cell 1 is as before indicated by the stitched outline. The twin electrodes $b_m$ and $c_m$ act as an exciter unit which causes the subcells $\alpha_{n1}$, ($\alpha_{n2}$ for all electrodes along the length of the twin electrodes to be subjected to compression/dilation along the local poling direction in the ferroelectric material. As well-known in the literature, a piezoelectric response is elicited from the subcells $\alpha_{n1}$, $\alpha_{n2}$ with a polarity that is dependent upon the poling direction. In FIGS. 5a and 5b are shown the positions of the twin electrodes $b_m$, $c_m$ at two instants representing extrema in a vibration cycle. In FIG. 5a the twin electrodes $b_m$, $c_m$ are far apart, and all cells $\alpha_{n1}$ and $\alpha_{n2}$ along the length of the twin electrodes $b_m$, $c_m$ are compressed laterally. In FIG. 5b, corresponding to a later point in time, the twin electrodes $b_m$, $c_m$ have moved to reduce the gap between them, stretching the cells $\alpha_{n1}$ and $\alpha_{n2}$ on either side. Via the piezoelectric effect which acts cooperatively between cells $\alpha_{n1}$ and $\alpha_{n2}$ at each electrode $a_n$ . . . , voltages are generated between each electrode $a_n$ . . . and a suitable reference (e.g., the average or median potential on electrodes $b_m$ and $c_m$). The phase or instantaneous polarity of these voltages can then be uniquely linked to the logic state in each memory cell 1 represented by the crossing point between an electrode $a_n$ . . . and the twin electrodes $b_m$, $c_m$. Several distinct readout schemes can be based on this basic vibration scheme, as exemplified immediately below.

EXAMPLE 1

Resonant Excitation

Depending on materials, dimensions and selected geometries, the vibratory motion indicated in FIGS. 5 may be resonantly excited. As can be easily ascertained based on relevant choices of material, the free vibration frequencies of structures as shown in FIG. 5 with micrometer-sized cell widths shall be quite high, i.e. in the hundreds of kHz to hundreds of MHz region. Depending on the Q value achieved, readout can be performed with low voltage excitation on the twin electrodes $b_m$, $c_m$, minimizing pick-up and crosstalk in the readout signals. Finally, one notes that the readout scheme in FIG. 5 provides opportunities for large-scale parallelism and correspondingly high data output rates.

EXAMPLE 2

Ring-Down Detection

Providing a sufficiently high mechanical Q value is achieved, the vibrations shown shall persist for a time after the electrical excitation of the twin electrodes $b_m$, $c_m$ has been turned off, permitting read-out free from disturbing excitation voltages.

EXAMPLE 3

Impulse Detection

Instead of exciting the twin electrodes $b_m$, $c_m$ with a sinusoidal or other periodic voltage, a single step or delta pulse may be applied, causing compression or dilation of the $\alpha_{n1}$ and $\alpha_{n2}$ cells. An analogy is piezoelectric spark generators. This provides a very fast means of readout, since the transit time of a compressional sound wave across the subcells $\alpha_{n1}$ and $\alpha_{n2}$ is in the sub-nanosecond regime in typical memory structures.

Figure 6A:
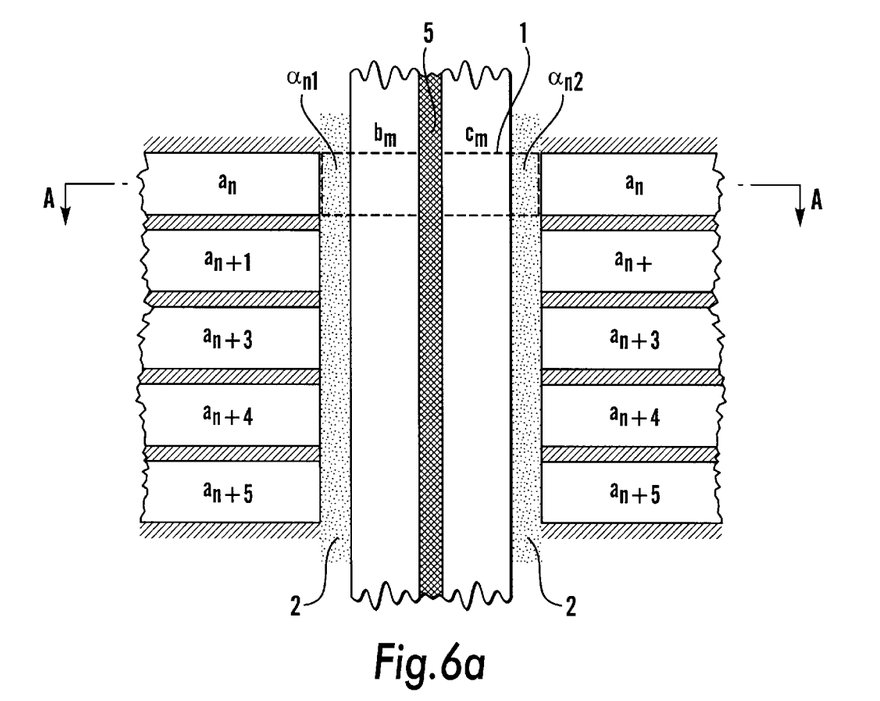
Figure 6B:
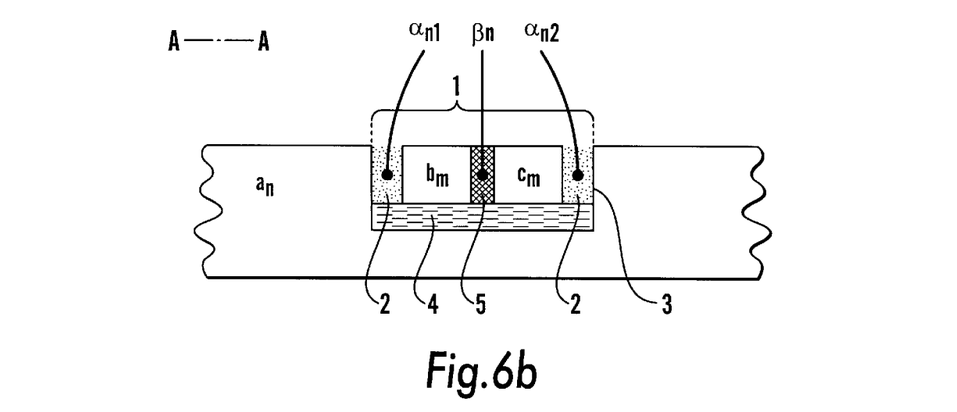

FIGS. 6a and 6b illustrate respectively in plan view and in cross section taken along line A—A in FIG. 6a a memory device structure which is quite similar in many respects to those shown in FIGS. 1 and 2, but where the twin electrodes $b_m$, $c_m$ are excited in a different way during readout of data. Correspondingly, there are certain physical differences in the overall structure, and in the encoding (writing) and reading of data. The volume or gap $\beta_n$ between the twin electrodes $b_m$, $c_m$ is now filled with a material which in addition to being electrically insulating and non-piezoelectric adheres well to both of the twin electrodes, keeping them at a fixed distance from each other. Poling of the subcells $\alpha_{n1}$ and ($\alpha_{n2}$ of a memory cell 1 at each electrode $a_n$, $a_{n+1}$, $a_{n+2}$, . . . proceeds as shown in FIG. 7, in analogy with the coordinated voltage protocols mentioned below with reference to FIG. 7 in connection with FIGS. 3 and 4.

Figure 7A:
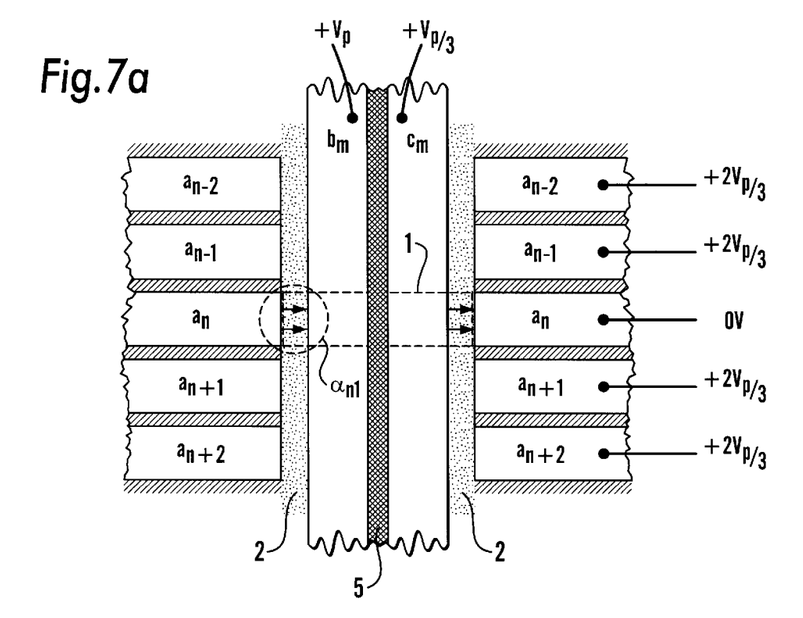
Figure 7B:
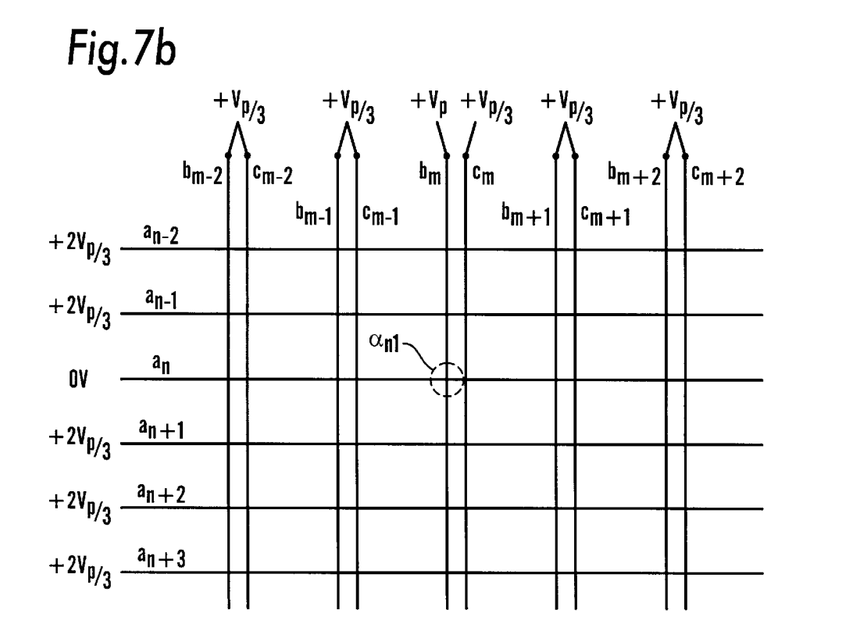
Figure 7C:
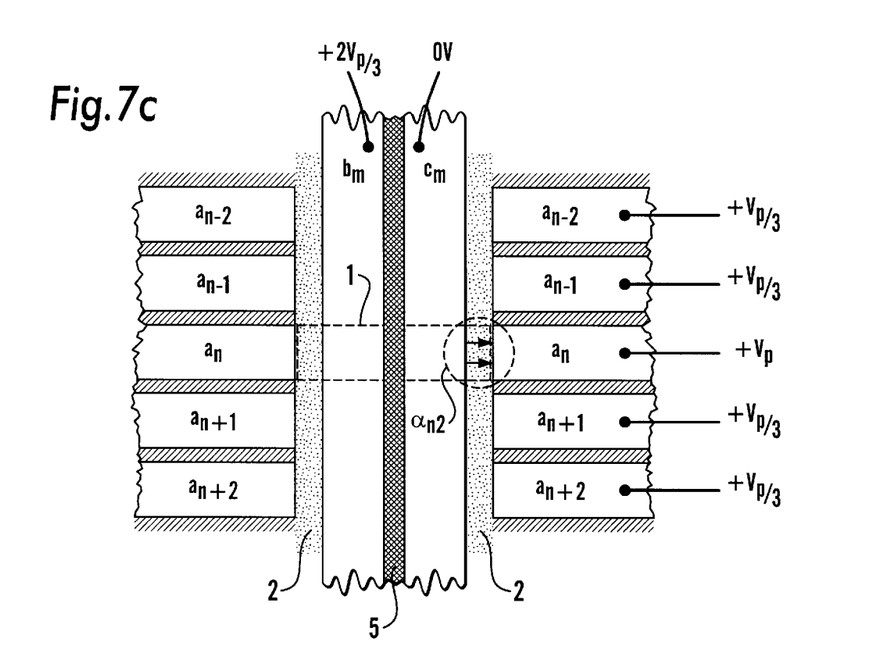
Figure 7D:
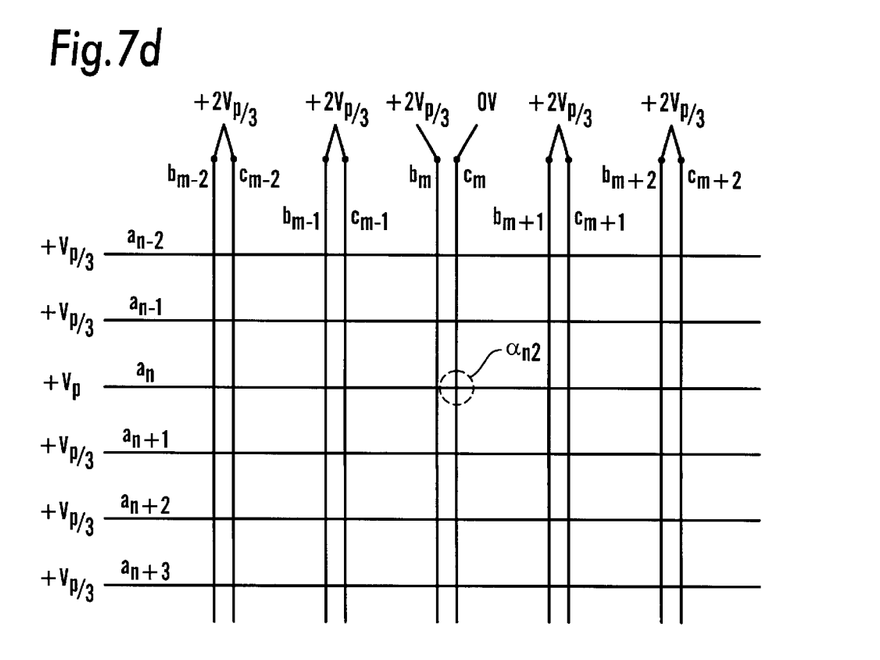

FIGS. 7a–7d show how subcells $\alpha_{n1}$ and $\alpha_{n2}$ of a memory cell 1 can be poled with mutually opposite poling directions relative to the opposing twin electrode. The plan view of FIG. 7a and the corresponding matrix arrangement in FIG. 7b show the poling of subcell $\alpha_{n1}$ in a memory cell 1 indicated by the stitched outline, while similarly FIGS. 7c and 7d show the poling of a subcell $\alpha_{n2}$ in the same arrangement. Since there is no longer any need for or danger of polarizing any ferroelectric material in the volume $\beta_n$, this is now possible, even in a passive matrix and with non-selected subcells not being exposed to disturb voltages exceeding $V_p/3$. Thus, in principle all 4 permutations of poling alternatives in the two cells $\alpha_{n1}$ and $\alpha_{n2}$ can be realized.

Figure 8A:
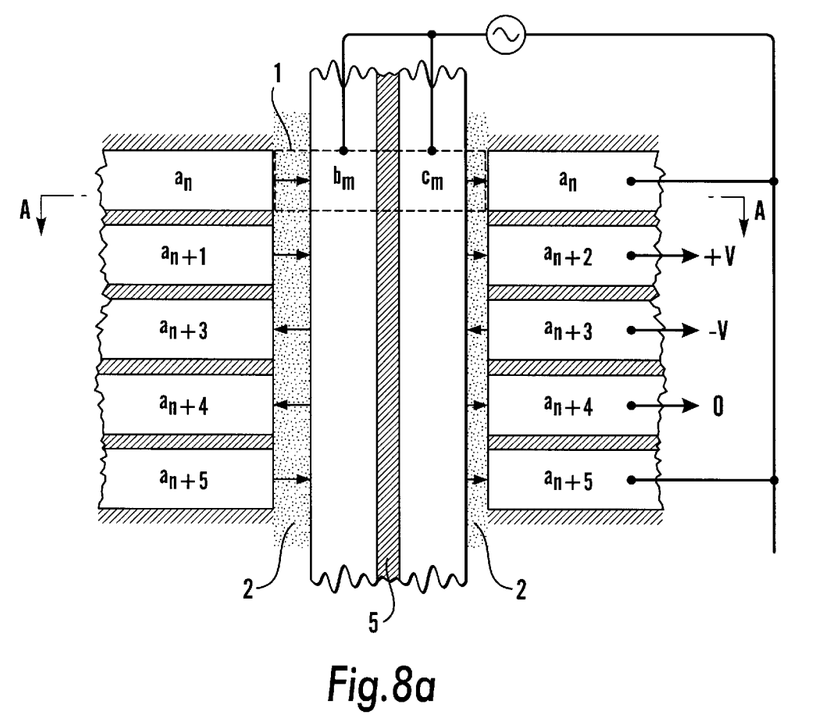
Figure 8B:
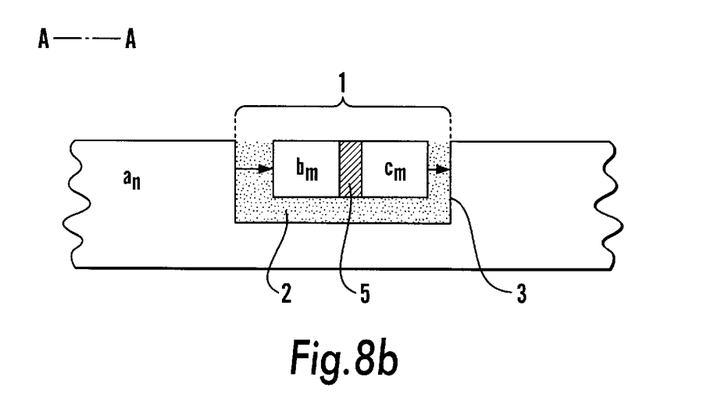
Figure 8C:
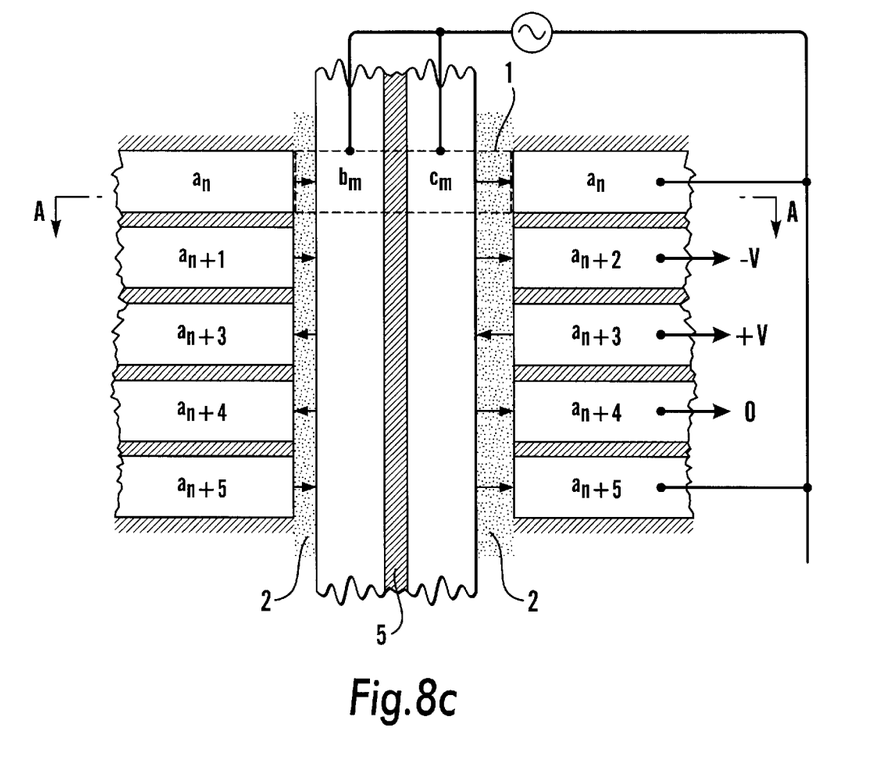
Figure 8D:
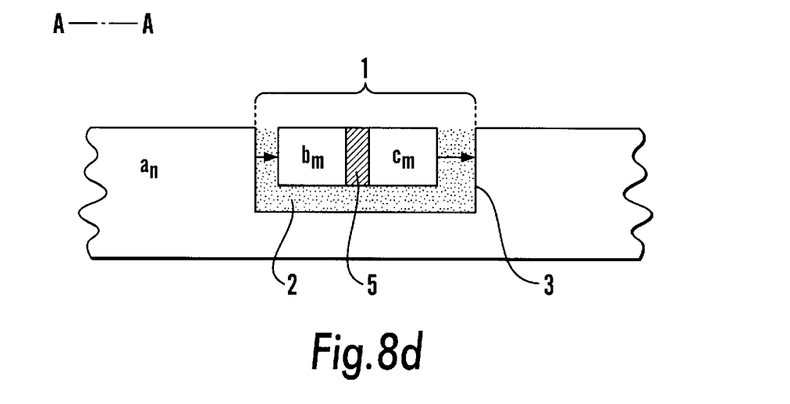

FIGS. 8a–8d show readout of data from a memory cell 1 in the arrangement as shown in FIGS. 6 and 7. FIGS. 8a and 8c show a portion of the apparatus according to the invention the memory in plan view, while FIGS. 8b and 8d show the respective cross sections thereof taken along the lines A—A of FIGS. 8a and 8c. Again the location of a memory cell 1 with subcells $\alpha_n$ . . . , $\beta_n$ is indicated by a stitched outline. As shown, subcells $\alpha_n-\alpha_{n+5}$ adjoining the electrodes $a_n-a_{n+5}$ have been poled such that when a voltage is applied between these electrodes and the twin electrodes $b_m$, $c_m$, a net force is exerted upon the twin electrodes $b_m$, $c_m$, pulling/pushing them to one side. Applying a sinusoidal voltage causes a right-left vibration of the twin electrodes $b_m$, $c_m$ as a unit, as shown in FIGS. 8a and 8b at two points in time. Clearly, the number and positions of driver units such as those on electrodes $a_n$ and $a_{n+5}$ can be selected in each specific case, to achieve adequate overall excitation of the twin electrodes $b_m$, $c_m$ without sacrificing too much memory capacity. In FIG. 8a the memory cells 1 on electrodes $a_{n+2}$, $a_{n+3}$ and $a_{n+4}$ are encoded with data that yield a response +V, –V and 0 V, respectively, at that point in the excitation cycle. The voltages are generated piezoelectrically, and the discussion on different modes of excitation connection with FIG. 5 above also applies here. One notes that the option of multibit encoding in the present case to a certain extent mitigates the disadvantage of using $\alpha_{n1}$ and $\alpha_{n2}$ cells for excitation purposes.

Not shown in the above-referred figures is how a layer of insulating material may be applied to seal and protect the memory cells and ancillary circuitry.

In practice, the material on top of the moving parts of the overall device must be selected and applied so as to avoid unduly damping or inhibiting the motion. In addition, an electrically conducting layer may be applied on top of the insulating layer, to provide electrical shielding against noise and pick-up. In cases where it is desired to build stacked structures on top of the first layer as described here, it may be required to include planarizing procedures and materials between layers in a stack, etc. This is considered obvious to persons skilled in the art, and shall not be discussed further here.

As is apparent from the above, the present invention provides new opportunities for building densely arrayed piezoelectric microstructures that are essentially planar and compatible with multilayer stacking. The micromechanical motion takes place in a well-defined volume with precisely controlled materials and dimensions. A novel passive matrix architecture with dual electrodes provides a number of different ways of constructing memory cells, as well as writing data thereto, retrieving data therefrom and once more writing new data thereto. Extensions and variants of those exhibited here as the herein above-disclosed preferred embodiments would be obvious to persons skilled in the art, and shall be claimed as included in the present patent application.

The present invention provides a passive matrix-addressable array of memory cells which in its overall aspects already is known from the prior art devices, wherein a layer of memory material, e.g. of ferroelectric polymer, is sandwiched between a first electrode layer with parallel strip-like electrodes and a second layer of parallel strip-like electrodes, but oriented orthogonally to the electrodes of the first set, whereby any memory cell in the array can be uniquely addressed for a write/read operation. A very high storage density can be obtained in the prior art devices as the device thickness may be a fraction of a micrometer and the electrodes provided in a dense arrangement and with an obtainable memory cell pitch approaching the line width or minimum feature size that can be provided by the resolution presently offered by photolithographic and etching techniques used for patterning the electrodes. The memory layer is of course laid down as a global and continuous layer in the device and needs no patterning. The implication of a memory cell size and the memory cell pitch that may approach the minimum feature size as obtainable with present photomicrolithographic and etching techniques, offers the possibility of an area storage density of about 25 bit/$\mu m^2$ or even more, with one bit per memory cell.

In the present invention the trench 3 must in order to accommodate the twin electrodes b, c provided therein and patterned with the conventional technologies, have a width at least twice that of a minimum feature size as provided by available design rules. As in the case of the prior art, however, the electrodes in the present invention all can be provided in a so-called dense arrangement, see for instance published International application WO03/041084, and the distance between the parallel neighbour trenches which are oriented orthogonally to the electrodes α can in practice be made very small, as it is envisaged that also the trenches 3 can be provided in a dense arrangement. This would, however, still imply that the area storage density in the apparatus according to the invention would be less than one half of that achievable with prior art memory devices with dense electrode arrangements, but one should then also bear in mind that the thickness of the memory matrix in present invention shall be equal to the thickness of the electrodes α. In other words, all functional parts of the apparatus of the present invention is contained within the electrode layer that constitutes the electrodes α, and this contrasts with prior art sandwich structures where the memory matrix consists of three consecutive stacked layers, as mentioned above. This offers the possibility of the apparatus according to the present invention providing an improved volumetric storage density, i.e. the number of memory cells or bits stored per volume unit would be comparable to that of the prior art technologies and could be further improved by resorting to multibit coding, if that is implemented in present invention. It should also be noted that the apparatus according to the present invention, i.e. the memory matrix, could be used to form a volumetric data storage apparatus similar to the volumetric devices known in the prior art, by stacking the inventive memory matrices on the top of each other, as the displacements or motions of the electrodes b, c take place laterally, i.e. in a horizontal direction, and the stress vectors in the memory material have the same direction. Thus no vertical up-down movements occur and memory matrices of the stack are not detrimentally disturbed by the piezoelectric activation of the memory cell of a particular memory matrix or device in the stack. The general concept of stacking is well-known in prior art technology and shall hence not be further discussed here.

In addition of course, the present invention achieves the added benefit that the reliance of piezoelectric properties of the ferroelectric memory material shall provide for a shorter access time and a significantly improved signal/noise ratio as compared with the prior art ferroelectric or electret matrix memories based on ferroelectric or electret polymer materials. These may as noted above be the presently most preferred material, viz. poly(vinylidenedifluoride-trifluoroethylene), but need not be limited thereto or to copolymers of the same family. Other candidate materials displaying both ferroelectric and piezoelectric properties have been contemplated by the applicant and include odd nylons, vinylidene-cyanide copolymers, polyurea, and polymers containing nitrile or imide groups.

What is claimed is:

1. A data storage apparatus with means for storing and retrieving data in respective write and read operations, wherein data are stored in a non-volatile manner as polarization states in ferroelectric memory cells, wherein the memory cells are provided in a passive matrix-addressable array, wherein the memory cells can be individually addressed electrically for write and read operations, the addressing of the memory cell taking place via crossing electrodes of a respectively first and second electrode sets, wherein each electrode set comprises parallel stripe-like electrodes such that the electrodes of the first set substantially are oriented orthogonally to the electrodes of the second set, characterized in that the first set of electrodes (a) comprises a plurality of parallel trenches (3) extending horizontally with an orthogonal orientation to the electrodes (a) and vertically downwards from a top surface thereof for a distance less than the thickness of the electrodes (a) and having a substantially rectangular profile, that at least a ferroelectric or electret memory material (2) is provided in the trenches (3) and covering the sidewalls thereof, that the second set of electrodes is provided as a dual set of electrodes, each comprising parallel twin electrodes (b, c) provided in said trenches (3) and parallel therewith and without mutual contact with the electrodes (a) of said first set, that the ferroelectric material (2) is provided in at least a portion of the volume of the trenches (3) not occupied by the electrodes (b, c), said ferroelectric or electret material being a soft or elastic ferroelectric or electret material with piezoelectric properties and in addition providing electrical insulation between the electrodes (b, c) of the second set and the electrodes (a) of the first set, whereby the twin electrodes (b, c) of the second set under a suitably applied force can be displaced laterally in the soft ferroelectric or electret material (2) with piezoelectric properties such that a piezoelectric effect is generated therein, and that said soft ferroelectric or electret material with piezoelectric properties in the volumes between the twin electrodes (b, c) of the second set and the electrodes (a) of the first set forms subcells ($\alpha_1$, $\alpha_2$) of the memory cells (1) in said trenches (3), said subcells ($\alpha_1$, $\alpha_2$) capable of being poled for a write operation by applying an electric field between respective twin electrodes (b; c) and crossing electrodes (a) of the first set, such that the memory cells (1) are polarized to store at least one of two or more logical values in the form of a set of polarization states in said subcells ($\alpha_1$, $\alpha_2$) and can be read non-destructively by applying a voltage potential between the twin electrodes (b, c), and/or between at least one of the latter and at least one of proximal electrodes (a) of the first electrode set, and over ferroelectric or electret material of the subcells ($\alpha_1$, $\alpha_2$) which are subjected to tensile and/or compressive stresses enabling the detection of parameters deriving from the polarization states thereof by means of piezoelectric effects in response to strains thus induced in said subcells, whereby the logic state of the subcells ($\alpha_1$, $\alpha_2$) of a memory cell (1) can be found and the logical value or values stored in a memory cell (1) containing the subcells ($\alpha_1$, $\alpha_2$) can be determined.

2. An apparatus according to claim 1, characterized in that said soft ferroelectric or electret material (2) is a ferroelectric polymer.

3. An apparatus according to claim 1, characterized in that ferroelectric or electret material (2) and said twin electrodes (b, c) are supported by a layer on non-ferroelectric or non-electret material (4) located at bottom surface of the trench (3).

4. An apparatus according to claim 1, characterized in that the bottom layer (4) can be bonded or not bonded to other materials and structures in said trench (3) and optionally selected as an elastomer.

5. An apparatus according to claim 4, characterized in that a gap (β) between said twin electrodes (b, c) is filled with a ferroelectric or electret material (2).

6. An apparatus according to claim 4, characterized in that the gap (β) between said twin electrodes (b, c) is filled with a non-piezoelectric material (5) bonded to both.

7. Apparatus according to claim 4, characterized in that said twin electrodes (b, c) form a mechanically resonant structure, with said twin electrodes oscillating relative to each other with the gap (β) between them opening/closing.

8. An apparatus according to claim 1, characterized in that said twin electrodes (b, c) form a mechanically resonant structure, with said twin electrodes oscillating sideways in the trench (3), the distance between them remaining constant.

9. Apparatus according to claim 1, characterized in that one or more mechanically and/or electrically insulating layers are provided over the top surface of the electrodes (a, b, c) and the memory cells (1).

10. A non-destructive readout method in a data storage apparatus according to claim 1, characterized by the readout of data being performed by subjecting the subcells ($\alpha_1$, $\alpha_2$) of the memory cells (1) selected for read operations to tensile and/or compressive force and concurrent detection of phase and/or polarity and/or magnitude of piezoelectrically generated voltage or current from said subcells ($\alpha_1$, $\alpha_2$) in response to strains resulting from the application of said tensile and/or compressive force.

11. A method according to claim 10, characterized by said tensile and/or compressive force being transmitted by the motion of electrodes (b, c) that are part of the physical structure defining a given memory cell (1).

12. A method according to claim 11, characterized by said motion being parallel to the surface on which said array of memory cells (1) is supported.

13. A method according to claim 11, characterized by said tensile and/or compressive force being generated by the application of electric fields to poled ferroelectric or electret material proximate to said electrodes (b, c).

14. A method according to claim 13, characterized by said ferroelectric or electret material (2) being a polymer.

15. A method according to claim 14, characterized by said ferroelectric or electret polymer (2) being the same material as used in subcells ($\alpha_1$, $\alpha_2$).

16. A method according to any of the claims 10, characterized by said tensile and/or compressive force varying cyclically in time.

17. A method according to claim 16, characterized by detection of a thereby piezoelectrically generated voltage or current being performed with coherent averaging or lock-in technique.

18. A method according to claim 10, characterized by said tensile and/or compressive force being a single step pulse.

19. A method according to claim 10, characterized by said tensile and/or compressive force being a delta pulse or burst of such pulses.

20. A method according to claim 11, characterized by said electrodes (b, c) acting upon two or more memory cells (1) simultaneously.

21. A method for poling pairs of subcells ($\alpha_1$, $\alpha_2$) in memory cells (1) for write operations in a data storage apparatus according to claim 1, characterized by poling each cell ($\alpha_1$, $\alpha_2$) of the pair in one of two poling directions oriented orthogonally relative to the twin electrodes (b, c) opposing each cell ($\alpha_1$, $\alpha_2$) of the pair, whereby all four possible permutations of the poling directions can be realized in the two cells ($\alpha_1$, $\alpha_2$) of the pair.

* * * * *